(12) United States Patent
Deck et al.

(10) Patent No.: US 8,050,053 B2
(45) Date of Patent: Nov. 1, 2011

(54) ELECTRONIC CIRCUIT ARRANGEMENT FOR CONTROL PURPOSES

(75) Inventors: Bernhard Deck, Weilheim (DE); Ernst Johansen, Sulz (CH); Bernhard Loher, Montlingen (CH); Franz Zurfluh, Brugg (CH); Hans-Peter Zueger, Brugg (CH); Paul Rudolf, Villigen (CH)

(73) Assignee: ABB Research Ltd, Zurich (CH)

( * ) Notice: Subject to any disclaimer, the term of this patent is extended or adjusted under 35 U.S.C. 154(b) by 0 days.

(21) Appl. No.: 11/976,891

(22) Filed: Oct. 29, 2007

(65) Prior Publication Data

US 2008/0089042 A1    Apr. 17, 2008

Related U.S. Application Data

(63) Continuation of application No. PCT/CH2006/000256, filed on May 12, 2006.

(30) Foreign Application Priority Data

May 13, 2005    (EP) .................................. 05405344

(51) Int. Cl.
*H05K 1/11* (2006.01)
(52) U.S. Cl. ........................ 361/803; 361/784
(58) Field of Classification Search .............. 361/760, 361/784, 803; 700/292
See application file for complete search history.

(56) References Cited

U.S. PATENT DOCUMENTS

| | | | |
|---|---|---|---|
| 5,166,862 A | 11/1992 | Durivage, III et al. | |
| 5,822,168 A * | 10/1998 | Boudet et al. | 361/187 |
| 6,113,260 A * | 9/2000 | Genrich et al. | 714/795 |
| 6,246,928 B1 * | 6/2001 | Louis et al. | 700/292 |
| 2001/0001535 A1 * | 5/2001 | Johnson et al. | 323/282 |
| 2004/0094397 A1 * | 5/2004 | Gemme et al. | 200/401 |
| 2004/0252421 A1 * | 12/2004 | Knox et al. | 361/23 |
| 2005/0286268 A1 * | 12/2005 | Teichmann | 363/16 |

FOREIGN PATENT DOCUMENTS

EP    0 792 096    8/1997

OTHER PUBLICATIONS

PCT/ISA/210, Apr. 2005.
PCT/ISA/237, Apr. 2005.
EPO Form 1507 0, Oct. 2005.

* cited by examiner

*Primary Examiner* — Yuriy Semenenko
(74) *Attorney, Agent, or Firm* — Buchanan Ingersoll & Rooney PC

(57) ABSTRACT

The electronic circuit arrangement for controlling a process device comprises a process interface circuitry and a processing circuitry, wherein the process interface circuitry is designed for receiving process signals from the process device and converting the process signals into converted signals and/or digital data, which converted signals and/or digital data are transmitted to the processing circuitry, and wherein the processing circuitry is designed for processing the converted signals and/or digital data and for outputting processed signals and/or digital data, which processed signals and/or digital data are transmitted to the process interface circuitry, and wherein the process interface circuitry is designed for converting the processed signals and/or digital data into control signals, which control signals are transmitted to the process device. The process interface circuitry comprises one or more first printed circuit board assemblies, and the processing circuitry comprises one or more second printed circuit board assemblies, which second printed circuit board assemblies are different from the first printed circuit board assemblies, and wherein each second printed circuit board assembly is electrically connected to at least one of the first printed circuit board assemblies. The circuit arrangement may find applications in high or medium voltage devices, in drives and in power converters.

20 Claims, 1 Drawing Sheet

ELECTRONIC CIRCUIT ARRANGEMENT FOR CONTROL PURPOSES

RELATED APPLICATIONS

This application claims priority under 35 U.S.C. §119 to EP Application 05405344.2 filed in European Patent Office on 13 May 2005, and as a continuation application under 35 U.S.C. §120 to PCT/CH2006/000256 filed as an International Application on 12 May 2006 designating the U.S., the entire contents of which are hereby incorporated by reference in their entireties.

TECHNICAL FIELD

The disclosure relates to the field of electronic circuit engineering and in particular to electronic circuit arrangements for controlling a process device. Such electronic circuit arrangements find application, e.g., in high or medium voltage switching technology, drive technology and power conversion technology.

BACKGROUND INFORMATION

Electronic control circuits for controlling a process device are known from the art. They receive process signals from the process device, which are converted into converted signals and/or digital data, which converted signals and/or digital data are then processed in the electronic control circuit. Processed signals and/or digital data, which result from the processing, are then converted into control signals, which control signals are then transmitted to the process device.

It is known from the art to arrange such electronic control circuits using electronic components on a printed circuit board (PCB). Such a (single) PCB with components fitted is also called a printed circuit board assembly (PCBA).

During the envisaged lifetime of such an electronic control circuit, a failure of a component of the electronic control circuit may occur, whereupon that component should be replaced. Particularly in the case of long envisaged lifetimes (of the order of 10 to 30 years), a suitable component for replacement may not be available anymore, which unfortunately can make it necessary to replace the whole PCBA and therefore the whole control circuit.

SUMMARY

An electronic circuit arrangement is disclosed for controlling a process device that does not have the disadvantages mentioned above. An electronic circuit arrangement is disclosed which can be used for a long time without the necessity to replace the full circuit because of lacking replacement components.

The problem is solved by apparatuses and a method as disclosed.

According to the disclosure an electronic circuit arrangement for controlling a process device comprises
a process interface circuitry, and
a processing circuitry,
wherein the process interface circuitry is designed for receiving process signals from the process device and converting the process signals into converted signals and/or digital data, which converted signals and/or digital data are transmitted to the processing circuitry, and
wherein the processing circuitry is designed for processing the converted signals and/or digital data and for outputting processed signals and/or digital data, which processed signals and/or digital data are transmitted to the process interface circuitry, and
wherein the process interface circuitry is designed for converting the processed signals and/or digital data into control signals, which control signals are transmitted to the process device.
It is characterized in that
the process interface circuitry comprises one or more first printed circuit board assemblies (PCBAs),
the processing circuitry comprises one or more second printed circuit board assemblies (PCBAs),
which second PCBAs are different from the first PCBAs, and
wherein each second PCBA is electrically connected to at least one of the first PCBAs.
None of the first PCBAs is identical with any of the second PCBAs.

Through this, it is possible to have the processing circuitry physically separated from the process interface circuitry, so that it is possible to replace the processing circuitry (or parts of it), while leaving the process interface circuitry untouched. Such processing circuitries usually comprise components with a fast innovation cycle, so that, after a number of years, they are outdated and hard to procure. Possible replacement components that would be available after many years mostly would have different specifications and/or footprints. By means of the disclosure it is possible to design a new printed circuit board assembly (or new printed circuit board assemblies) for the processing circuitry only, using such replacement components with different specifications. The printed circuit board assembly (or printed circuit board assemblies) comprising the process interface circuitry may, on the other hand, remain unchanged.

Usually, the process interface circuitry can be designed such that it only or mainly comprises components that have a slow innovation cycle (discrete components like resistors, capacitors and the like, or analog-to-digital converters). Upon failure of one of such components, it will usually be possible to find a 1:1 replacement component even after decades, so that no redesign of the process interface circuitry would be required.

In an exemplary embodiment the electronic circuit arrangement comprises at least one digital signal processing chip (DSP chip), and all DSP chips of the electronic circuit arrangement are arranged in the processing circuitry. DSP chips have a rather fast innovation cycle, so that it is advantageous to design the electronic circuit arrangement such that all the DSP chips, which it comprises, are foreseen in the processing circuitry, so that all the DSP chips are located in second PCBAs, whereas the first PCBA or PCBAs are free from DSP chips.

Preferably, all the DSP chips are arranged to be programmed with programming information initially received from or via the process interface circuitry. I.e., the DSP chips (which are part of the processing circuitry) are to be programmed by means of the process interface circuitry or by means of data provided to the processing circuitry via the process interface circuitry or by data initially transferred to the processing circuitry on a first system start and then kept in a non-volatile memory of the processing circuit. For example, the process interface circuitry may comprise a controller, which contains the data required to program the DSP. For programming the DSP chip (upon any start/restart of the electronic circuit arrangement), the appropriate programming information is then extracted from the controller and sent to the processing circuitry. This allows for a very versatile use of the processing circuitry. The same processing circuitry may be used for various purposes, depending on the process interface ciruitry which it is used together with. In another example, a non-volatile memory, e.g., a flash memory chip, may be associated with a DSP chip, e.g., a processor chip (microprocessor chip). Preferably, the memory chip is part of the processing circuit. That non-volatile memory chip can, upon first use of the processing circuitry together with the process interface circuitry, be filled with suitable controller information. Once the memory chip contains that information, a DSP chip (e.g., processor chip) may receive its programming information from that memory chip, whenever a restart occurs. On the first (initial) start, the controller information is transmitted to the processing circuitry from or via the process interface circuitry. E.g., the controller information may be fed into the process interface circuitry from a personal computer connected to the process interface circuitry.

In an exemplary embodiment at least one of the DSP chips (or the DSP chip) is a programmable gate array chip, in particular a field programmable gate array (FPGA). The use of a programmable gate array chip as DSP chip in circuit arrangements according to the disclosure is very advantageous, because such chips have a deterministic behaviour, which is crucial for achieving a great time precision in the controlling tasks. Processor chips on the other hand usually show a jitter of the order of milliseconds, which may be insufficient for various applications, e.g, in high or medium or low voltage switching or protection, in drive controlling tasks or in power conversion.

A DSP chip may also be an ASIC (application-specific integrated circuit) chip.

In another exemplary embodiment, at least one of the DSP chips (or the DSP chip) is a (microprocessor chip) chip. A processor chip is very well suited for taking over the function of a controller (for further DSP chips) and of a communication interface. In particular, the use of at least one (or exactly one) processor chip together with at least one (or exactly one) programmable gate array chip is preferred, because a programmable gate array chip is very well suited for arithmetics and calculation tasks like filtering or modulation, which very well complements with the preferred tasks of a processor chip. For example, the processor chip may, among other functions, function as controller for the programmable gate array chip and provide the programmable gate array chip with suitable programming information upon any start/restart; the processor chip itself may receive its programming information (upon any start/restart) from a flash memory chip, which preferably is part of the processing circuit and itself is once programmed on an initial start of the controlling circuitry. The processor chip may also receive its programming information from a controller component of the process interface circuitry upon every start/restart.

In another exemplary embodiment, the electronic circuit arrangement comprises at least one memory chip, and all memory chips of the electronic circuit arrangement are arranged in the processing circuitry. Memory chips have a very fast innovation cycle, so that it is very advantageous to design the electronic circuit arrangement such, that all the memory chips, which it comprises, are foreseen in the processing circuitry, so that all the memory chips are located in second PCBAs, whereas the first PCBA or PCBAs are free from memory chips.

In another embodiment, the processing circuitry is provided with connections solely to the process interface circuitry. It is preferred that the processing circuitry is foreseen to cooperate with a suitable process interface circuitry and not, in addition, with another circuitry. This dedication of the processing circuitry to the process interface circuitry can reduce the susceptibility to failures/errors of the electronic circuit arrangement and thus enhance its stability.

In another exemplary embodiment, the processing circuitry is realized in exactly one second printed circuit board assembly (PCBA), i.e. on one PCB. This enhances the manufacturability of the processing circuitry, allows for faster processing, and eases the handling.

In further exemplary embodiments, the process device is, e.g.,
 a high or medium voltage installation (device),
 a high or medium voltage switchgear
 a drive for a high or medium or low voltage switchgear,
 a protection device (e.g., switchgear or relay) for a high or medium or low voltage application,
 a drive, a motor drive, a magnetically actuated drive, or
 a power converter.

Accordingly, the disclosure also comprises, e.g.,
 any process device,
 a high or medium voltage installation (device),
 a switchgear drive,
 a protection device for high or medium or low voltage, in particular a protection device for high or medium or low voltage switchgear, or in particular a protective relay,
 a drive, in particular a motor drive and/or a magnetically actuated drive, and
 a power converter
with a control circuit according to the disclosure.

BRIEF DESCRIPTION OF THE DRAWINGS

Exemplary embodiments are illustrated in more detail in the included drawings. The figures show.

The reference symbols used in the figures and their meaning are summarized in the list of reference symbols. Generally, alike or alike-functioning parts are given the same reference symbols. The described embodiments are meant as examples and shall not confine the disclosure.

DETAILED DESCRIPTION

Figure 1:
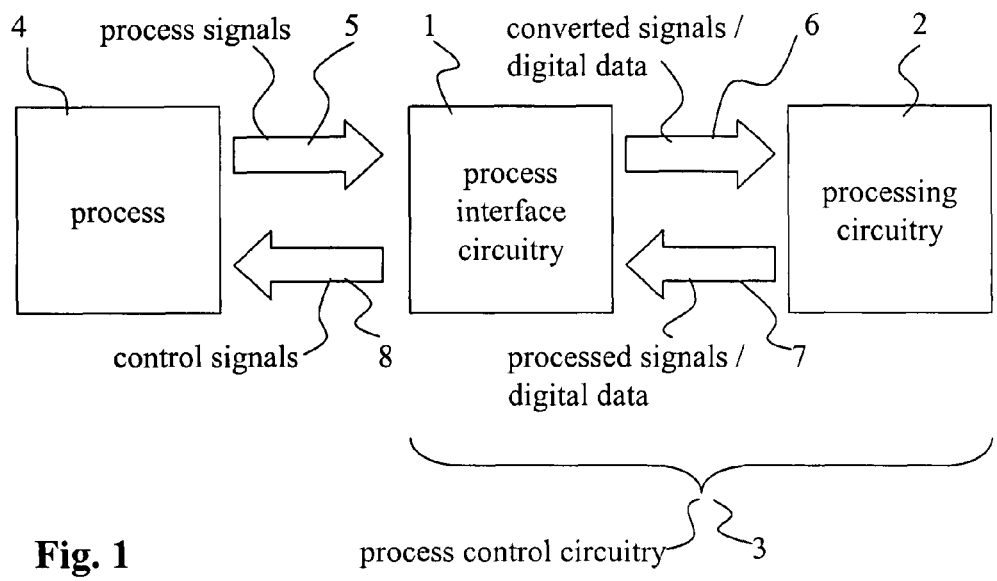
FIG. 1 a schematic illustration of the interactions between process device, process interface circuitry and processing circuitry.

FIG. 1 schematically shows the interactions between a process 4, a process interface circuitry 1 and a processing circuitry 2. The process interface circuitry 1 and the processing circuitry 2 together form a process control circuitry 3. The process control circuitry 3 is to control the process 4. Controlling usually will comprise both, open-loop and closed-loop controlling.

In the example to be discussed, the process 4 shall be assumed to be high or medium voltage switching. The process interface circuitry 1 receives process signals 5 from the process. Such process signals 5 may, e.g., be outputs from voltage or current sensors or status signals of relays or the like. In the process interface circuitry 1 the process signals 5 are converted, so as to obtain converted signals and/or digital data 6. These converted signals and/or digital data 6 are in a form suitable to be transmitted to the processing circuitry 2. Then, the converted signals and/or digital data 6 are processed in the processing circuitry 2.

Signals, like, e.g., the above-mentioned process signals 5 and converted signals 6, carry their information in a voltage level, which is to be interpreted. Digital data on the other hand, like, e.g., the above-mentioned digital data 6, carry their information in digital form; a protocol has to be used in order to interpret the digital data and decode the information.

As a result of the processing in the processing circuitry 2, processed signals and/or digital data 7 are obtained. These are transmitted to the process interface circuitry 1, in which they are converted into control signals 8. These control signals 8 are then transmitted to the process 4 and, e.g., result in an opening or closing of the high or medium voltage switchgear.

Figure 2:
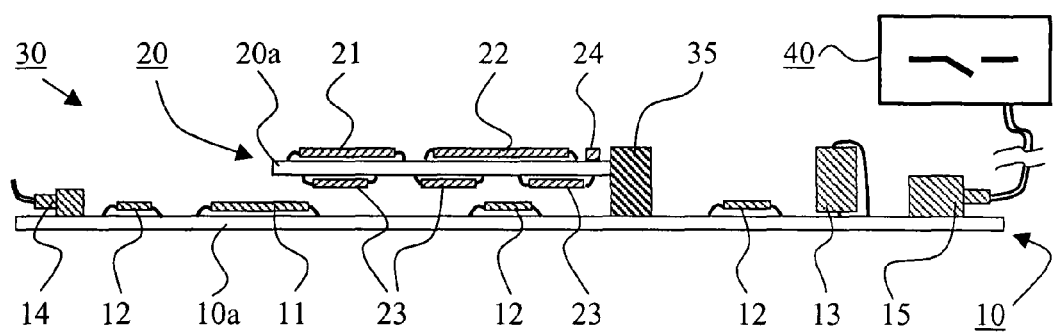
FIG. 2 a schematic side view of an electronic circuit arrangement according to the disclosure.

FIG. 2 shows a schematic side view of an electronic circuit arrangement 30. It comprises one first printed circuit board assembly (PCBA) 10 and one second printed circuit board assembly (PCBA) 20. The first PCBA 10 comprises a first printed circuit board (PCB) 10a and various components, and the second PCBA 20 comprises a second printed circuit board (PCB) 20a and various components.

The first PCBA 10 comprises the process interface circuitry 1, whereas the second PCBA 20 comprises the processing circuitry 2. The two PCBAs 10 and 20 are interconnected by means of a connector 35. Through the connector 35, e.g. a DIMM (Dual Inline Memory Module) connector, and through the layout of the first PCBA 10, a standardized interface for the second PCBA 20 may be defined. Through this standardization, a replacement of a second PCBA 20 and/or of the respective processing circuitry 2 may be realized even if replacement parts and components of the original PCBA 20 are no more available.

The process interface circuitry 1 may also be distributed on a number of PCBAs 10 (with one PCB each), and the processing circuitry 2 may also be distributed on a number of PCBAs 10 (with one PCB each).

The first PCBA 10 comprises, e.g., resistors 12, capacitors 13, metallically isolated inputs 15, which may be connected to the process device 40 (high or medium voltage switchgear, in FIG. 2 indicated very schematically), and analog-to-digital converters 11, which may also be connected to the process device 40 (connection not indicated in FIG. 2). Also digital-to-analog converters may be foreseen. Preferably, the first PCBA 10 is free from DSP chips and free from memory chips.

The second PCBA 20 comprises, e.g., two DSP chips, memory chips 23 and a quartz 24. The two DSP chips are a processor chip 21 and a programmable gate array chip 22 (preferably an FPGA 22). The quartz 24 is to provide for a clock signal for the DSP chips. A watchdog component is preferably also provided in the second PCBA 20 (not indicated in FIG. 2).

A controller component may be part of the process interface circuitry 1 or be embodied in form of a non-volatile memory chip as part of the programming circuitry (to be programmed by or via the process interface circuitry 1 on an initial start); wherein the processor chip 21 may receive its programming information from such a memory chip, and the programmable gate array chip 22 may receive its programming information from the processor chip 21.

If the process is a power conversion process and the process device is a power converter, the preferred power level is above 50 kW, preferably between about 100 kW to about 50 MW. And preferred applications are in excitation systems, rectifier stations and in traction.

Special chip housings, like ball grid array (BGA), multi chip module (MCM), chip-scale packages (CSP) or the like are not considered to constitute a PCBA or comprise a PCB in the sense as PCBA and PCB is used in this application, and neither do chips sockets or other sockets or connectors.

For the definition of high, medium and low voltage it is basically referred to the definition in the "IEC dictionary". In particular: High voltage means voltages generally above 1 kV, in particular above approximately 50 kV, typically 110 kV, 220 kV or 380 kV. Medium voltage means voltages approximately between 1 kV and 50 kV, typically 5, 10, 12, 20, 24 or 36 kV. Low voltage means voltages below 1 kV, typically 110, 220 or 380 V. The voltage values are rated voltages, for alternating currents.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

LIST OF REFERENCE SYMBOLS

1 process interface circuitry
10 first printed circuit board assembly (comprising the process interface circuitry)
10a first printed circuit board
11 analog-to-digital converter
12 resistor
13 capacitor
14 solid-state I/O, analogue input
15 solid-state I/O, metallically isolated input
2 processing circuitry
20 second printed circuit board assembly (comprising the processing circuitry)
20a second printed circuit board
21 DSP chip, FPGA
22 DSP chip, processor chip
23 memory chip
24 quartz
3 process control circuit
30 electronic circuit arrangement (comprising process control circuit)
35 connector
4 process
40 process device, medium voltage switchgear
5 process signals
6 converted signals and/or digital data
7 processed signals and/or digital data
8 control signals

What is claimed is:

1. An electronic circuit arrangement, comprising:
   a high or medium voltage process device,
   a process interface circuitry, and
   a processing circuitry,
   wherein the process interface circuitry is configured to receive process signals from the process device, convert the process signals into converted signals and/or digital data, and transmit the converted signals and/or digital data to the processing circuitry,
   wherein the processing circuitry is configured to process the converted signals and/or digital data, and output the processed signals and/or digital data to the process interface circuitry,
   wherein the process interface circuitry is configured to convert the processed signals and/or digital data into control signals, and transmit the control signals to the process device, wherein
- the process interface circuitry is arranged on at least one first printed circuit board assembly,
- the processing circuitry is arranged on at least one second printed circuit board assembly physically distinct and separate from the at least one first printed circuit board assembly,
- the at least one first printed circuit board assembly comprises at least one first-type component mounted thereon that has a first innovation cycle, and the at least one second board assembly comprises at least one second-type component mounted thereon that has a second innovation cycle faster than the first innovation cycle, wherein an innovation cycle of a component is an inverse of an amount of time since the component with a given specification and footprint was introduced,
- said at least one second-type component is mounted exclusively on the at least one second printed circuit board assembly,
- the at least one second printed circuit board assembly is physically separable from the at least one first printed circuit board assembly such that the at least one second-type component mounted exclusively on the at least one second printed circuit board assembly is removable from the electronic circuit independent of the at least one first printed circuit board assembly,
- each electrical connection from the processing circuitry of the at least one second printed circuit board assembly to components outside the at least one second printed circuit board assembly is connected solely to the process interface circuitry of the at least one printed circuit board assembly,
- the at least one second-type component of the at least one second printed circuit board assembly comprises a processor chip.

2. The electronic circuit arrangement according to claim 1, wherein each processor chip of the electronic circuit arrangement is arranged in the processing circuitry.

3. The electronic circuit arrangement according to claim 1, wherein the processor chip is configured to be programmed with programming information initially received from or via the process interface circuitry.

4. The electronic circuit arrangement according to claim 1, wherein the processor chip is a programmable gate array chip.

5. The electronic circuit arrangement according to claim 1, wherein the processor chip is a DSP chip.

6. The electronic circuit arrangement according to claim 1, wherein the processing circuitry is realized in exactly one second printed circuit board assembly.

7. The electronic circuit arrangement according to claim 1, wherein the process device is
- a high voltage installation,
- a medium voltage installation,
- a high voltage switchgear,
- a medium voltage switchgear,
- a drive for a high voltage switchgear,
- a drive for a medium voltage switchgear,
- a protection device for a high voltage application, or
- a protection device for a medium voltage-application.

8. The electronic circuit arrangement of claim 1, wherein the high or medium voltage process device comprises a high or medium voltage installation.

9. The electronic circuit arrangement of claim 1, wherein the high or medium voltage process device comprises a high or medium voltage switchgear.

10. The electronic circuit arrangement of claim 1, wherein the high or medium voltage process device comprises a protection device for high or medium voltage.

11. The electronic circuit arrangement of claim 1, wherein the high or medium voltage process device comprises a high or medium voltage drive.

12. The electronic circuit arrangement of claim 1, wherein the high or medium voltage process device comprises a high or medium voltage power converter.

13. The electronic circuit arrangement according to claim 1, wherein the at least one first-type component of the at least one first printed circuit board assembly comprises at least one of a resistor, a capacitor, an analog-to-digital converter, and an isolated input.

14. The electronic circuit arrangement according to claim 1, wherein the at least one second-type component of the at least one second printed circuit board assembly comprises at least one of a quartz and a watchdog component.

15. The electronic circuit arrangement according to claim 1, wherein each second-type component mounted on the second printed circuit board assembly has a faster innovation cycle than any component mounted on the first printed circuit board assembly.

16. The electronic circuit arrangement according to claim 1, wherein the at least one second-type component of the at least one second printed circuit board assembly comprises a memory chip.

17. The electronic circuit arrangement according to claim 1, wherein the process device is configured to operate at an operating voltage above approximately 1 kV, and
the processing circuitry is configured to control the process device to operate at the operating voltage.

18. The electronic circuit arrangement according to claim 1, wherein the process interface circuitry is realized in exactly one first printed circuit board assembly.

19. The electronic circuit arrangement according to claim 16, wherein each memory chip of the electronic circuit arrangement is arranged in the processing circuitry.

20. The electronic circuit arrangement according to claim 16, wherein the memory chip comprises non-volatile memory.

* * * * *